(12) United States Patent
Letts

(10) Patent No.: US 7,320,014 B2
(45) Date of Patent: Jan. 15, 2008

(54) METHOD AND APPARATUS FOR IDENTIFYING SIMILAR EVENTS IN LONG DATA RECORDS

(75) Inventor: Peter J. Letts, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 714 days.

(21) Appl. No.: 10/734,483

(22) Filed: Dec. 12, 2003

(65) Prior Publication Data
US 2005/0131974 A1    Jun. 16, 2005

(51) Int. Cl.
*G06F 17/15* (2006.01)
(52) U.S. Cl. ..................................... 708/422
(58) Field of Classification Search ................. 708/422
See application file for complete search history.

(56) References Cited

U.S. PATENT DOCUMENTS

| | | |
|---|---|---|
| 4,403,184 A | 9/1983 | Witt et al. |
| 4,553,221 A | 11/1985 | Hyatt |
| 4,603,703 A | 8/1986 | McGill et al. |
| 4,686,655 A | 8/1987 | Hyatt |
| 4,779,028 A | 10/1988 | Blair |
| 5,150,313 A | 9/1992 | Van De Engh et al. |
| 5,629,883 A | 5/1997 | Iwata |
| 5,869,752 A | 2/1999 | Klauber et al. |
| 5,978,742 A | 11/1999 | Pickerd |
| 6,237,014 B1 | 5/2001 | Freidin et al. |
| 6,529,842 B1 * | 3/2003 | Williams et al. .............. 702/66 |
| 6,763,129 B1 * | 7/2004 | Honda et al. ................ 382/132 |
| 6,950,747 B2 * | 9/2005 | Byerly .......................... 702/6 |

\* cited by examiner

*Primary Examiner*—Tan V. Mai
(74) *Attorney, Agent, or Firm*—Thomas F. Lenihan; Moser, Patterson, Sheridan, LLP

(57) ABSTRACT

Method and apparatus for correlating data records acquired in a signal acquisition device includes the steps of extracting an area of interest from the data record displayed on said signal acquisition device, normalizing the area of interest, creating a filter based upon normalized values of the area of interest and passing the data record through said filter to obtain a correlation curve. Normalization of the area of interest includes obtaining a plurality of points defining the area of interest, calculating the mean of the said plurality of points and subtracting said mean from each of the said plurality of points. Creating the filter includes using the normalized values of the area of interest as coefficients for the filter.

24 Claims, 3 Drawing Sheets

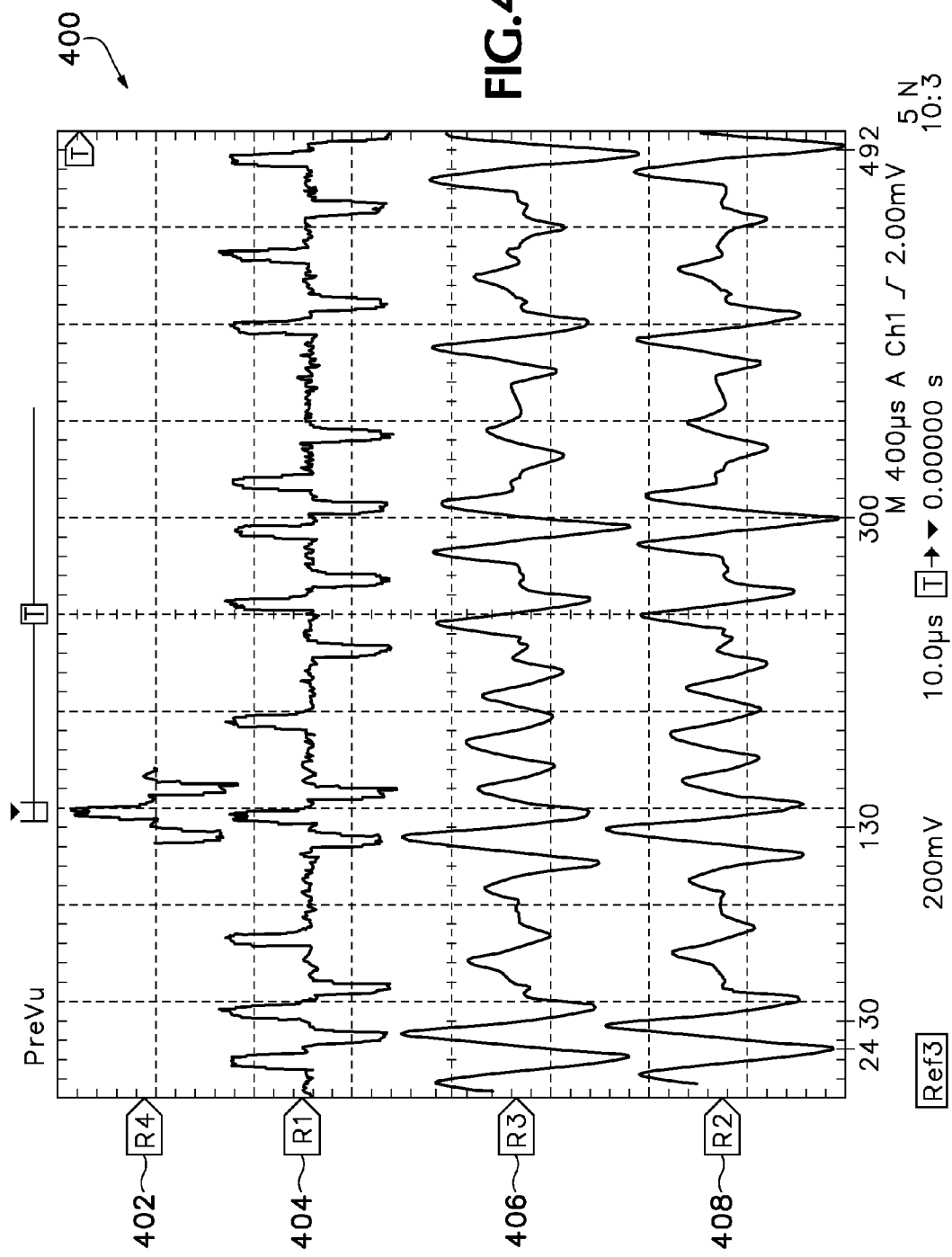

METHOD AND APPARATUS FOR IDENTIFYING SIMILAR EVENTS IN LONG DATA RECORDS

FIELD OF THE INVENTION

The invention relates generally to signal acquisition systems and, more particularly, to a method for identifying similar events in a data record using correlation.

BACKGROUND OF THE INVENTION

Signal acquisition devices such as digital storage oscilloscopes (DSOs) use a display grid that is fixed at eight divisions vertically by ten divisions horizontally similar to the grid pattern initially etched into the glass of the cathode ray tubes (CRT) of earlier analog oscilloscopes. The eight by ten division grid has lingered despite the fact that most engineering applications requiring the graphing of data are not limited to an eight by ten graticule. That is, in virtually all disciplines of science, data is typically graphed with scales that provide an appearance adapted for ease of interpreting the data. One disadvantage of the current standard oscilloscopes is their limitations to display the increasingly longer data records that are captured in modern scientific experimentation. For example, two typical settings for oscilloscopes are for the display of only a portion of a particular waveform.

Improvements in oscilloscope technology have resulted in the display of longer records (on the order of millions and tens of millions of points); however, this creates an extremely long data record that is difficult to analyze. Particularly, when looking for specific patterns or anomalies in waveforms displayed on the oscilloscope, an operator must visually review part of the waveform for points of interest, trends or other such anomalies and then attempt to review the entire long data record to identify such similar events (points of interest) in the record. For example, it may be desirable to record a signal on a track of a disc drive as it passes a given mark or location. Such a data capturing event creates a long record that may have waveform shapes that are more complex (curved) than patterns that are typically displayed (i.e., square or sine wave, sawtooth or exponential delay patterns). Accordingly, it is desired to have a method of identifying similar events in long data records.

SUMMARY OF INVENTION

These and other deficiencies of the prior art are addressed by the present invention of a method and apparatus for correlating data records acquired in a signal acquisition device including, in one embodiment of the invention, the steps of extracting an area of interest from said data record displayed on said signal acquisition device, normalizing the area of interest, creating a filter based upon normalized values of the area of interest, passing the data record through said filter to obtain a correlation curve and applying thresholds to the correlation curve to identify parts of the original waveform that are similar to the area of interest.

Normalization of the area of interest includes, in one embodiment of the invention, obtaining a plurality of points defining the area of interest, calculating the mean of the said plurality of points and subtracting said mean from each of the said plurality of points. Creating the filter, in one embodiment of the invention, includes using the normalized values of the area of interest as coefficients for the filter. In one embodiment of the invention, the filter is a Finite Impulse Response filter characterized by a one dimensional matrix. Applying thresholds to the correlation curve, in one embodiment of the invention, includes comparing the correlation value at each point with one or more user defined thresholds and marking the corresponding position(s) where a threshold is exceeded on a display of the original waveform. The apparatus of the subject invention includes a computer readable medium containing a program which, when executed, performs an operation of correlating an area of interest of an acquired waveform with said acquired waveform in accordance with the above described method. Another embodiment of the invention includes an apparatus for correlating data records having means for acquiring said data records, means for processing said data records by extracting an area of interest from said data record displayed on said signal acquisition device; normalizing the area of interest; creating a filter based upon normalized values of the area of interest; and passing the data record through said filter to obtain a correlation curve and means for displaying said data records and correlation curve.

BRIEF DESCRIPTION OF THE DRAWINGS

The teachings of the present invention can be readily understood by considering the following detailed description in conjunction with the accompanying drawings, in which:

FIG. 4 depicts a graphical representation of various waveforms acquired and subsequently produced in accordance with the subject invention.

To facilitate understanding, identical reference numerals have been used, where possible, to designate identical elements that are common to the figures.

DETAILED DESCRIPTION OF THE INVENTION

The subject invention will be described within the context of a signal acquisition device such as a digital signal oscilloscope (DSO). However, it will be appreciated that the subject invention has applicability to other signal acquisition devices and, more particularly, those signal acquisition devices or display devices providing time-based display of acquired data or other information.

The invention facilitates the analysis of long data records by identifying anomalies or other areas of interest (A of I) in a given portion of the data record and processing the A of I in such a manner as to find a correlation between the A of I and the rest of the data record without having to visually inspect or otherwise perform time consuming calculations to determine where and when such anomalies occur again in the data record.

Figure 1:
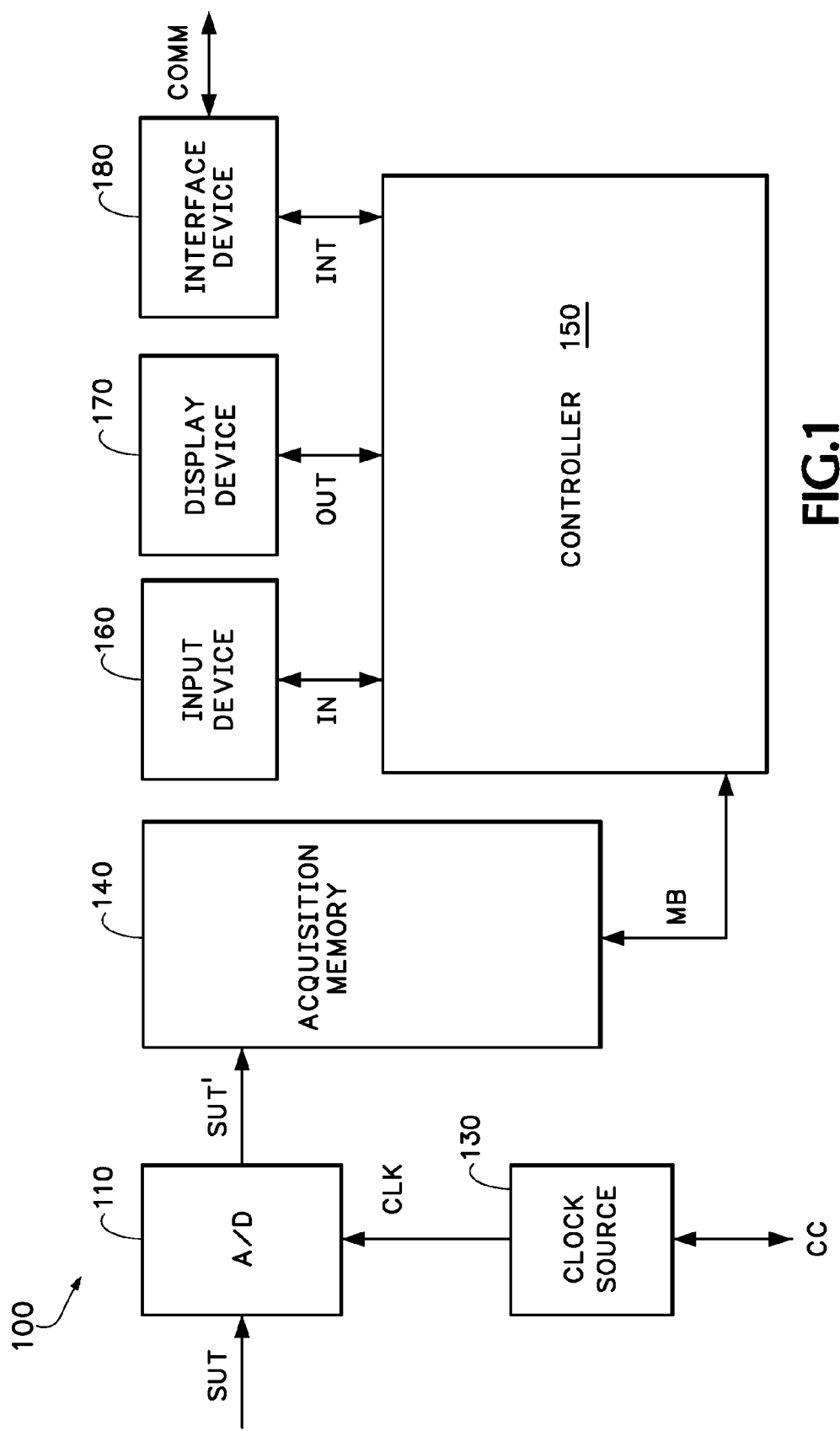
FIG. 1 depicts a high level block diagram of a signal acquisition system according to an embodiment of the present invention.

FIG. 1 depicts a high level block diagram of a signal acquisition system 100 according to one embodiment of the invention. Specifically, the system (signal acquisition system 100) of FIG. 1 comprises an analog to digital (A/D) converter 110, a clock source 130, an acquisition memory 140, a controller 150, an input device 160, a display device 170 and an interface device 180.

The A/D converter 110 receives and digitizes a signal under test (SUT) in response to a clock signal CLK produced by the clock source 130. The clock signal CLK is preferably a clock signal adapted to cause the A/D converter 110 to operate at a maximum sampling rate, though other sampling rates may be selected. The clock source 130 is optionally responsive to a clock control signal CC produced by the controller 150 to change frequency and/or pulse width parameters associated with the clock signal CLK.

A digitized output signal SUT' produced by the A/D converter 110 is stored in the acquisition memory 140. The acquisition memory 140 cooperates with the controller 150 to store the data samples provided by the A/D converter 110 in a controlled manner such that the samples from the A/D converter 110 may be provided to the controller 150 for further processing and/or analysis.

The controller 150 is used to manage the various operations of the system 100. The controller 150 performs various processing and analysis operations on the data samples stored within the acquisition memory 140. The controller 150 receives user commands via an input device 160, illustratively a keypad, pointing device, one or more knobs or selection buttons, and the like. The controller 150 provides image-related data to a display device 170, illustratively a cathode ray tube (CRT), liquid crystal display (LCD) or other display device. The controller 150 optionally communicates with a communications link COMM, such as a general purpose interface bus (GPIB), Internet protocol (IP), Ethernet or other communications link via the interface device 180. It is noted that the interface device 180 is selected according to the particular communications network used. An embodiment of the controller 150 will be described in more detail below.

The system 100 of FIG. 1 is depicted as receiving only one SUT. However, it will be appreciated by those skilled in the art that many SUTs may be received and processed by the system 100. Each SUT is preferably processed using a respective A/D converter 110, which respective A/D converter may be clocked using the clock signal CLK provided by a common or respective clock source 130 or some other clock source. Each of the additional digitized SUTs is coupled to the acquisition memory 140 or additional acquisition memory (not shown). Any additional acquisition memory communicates with the controller 150, either directly or indirectly through an additional processing element.

Figure 2:
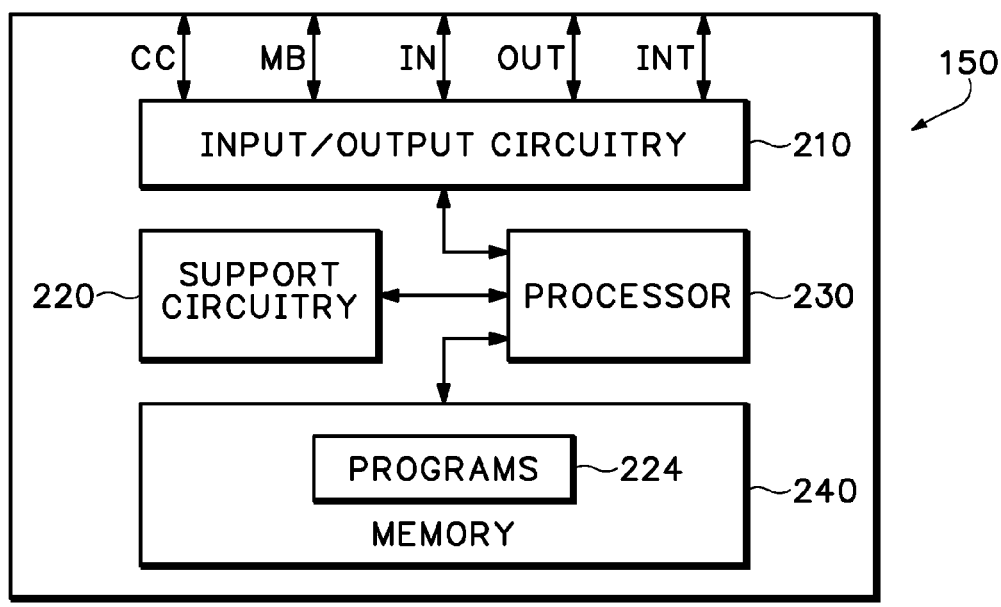
FIG. 2 depicts a high level block diagram of a processing and display controller suitable for use in the signal acquisition system of FIG. 1.

The details of an embodiment of controller 150 are depicted in FIG. 2. The controller 150 comprises a processor 230 as well as memory 240 for respectively executing and storing various control programs 244 and files including but not limited to the correlation method of the subject invention. The processor 230 cooperates with conventional support circuitry 220 such as power supplies, clock circuits, cache memory and the like, as well as circuits that assist in executing the software routines stored in the memory 240. As such, it is contemplated that some of the process steps discussed herein as software processes may be implemented within hardware, for example as circuitry that cooperates with the processor 230 to perform various steps. The controller 150 also contains input/output (I/O) circuitry 210 that forms an interface between the various functional elements communicating with the controller 150. For example, in the embodiment of FIG. 1, the controller 150 optionally communicates with the clock source 130 (via clock control signal CC). The controller 150 also communicates with the input device 160 via a signal path IN, a display device 170 via a signal path OUT and the interface device 180 via a signal path INT and the acquisition memory 140 via signal path MB. The controller 150 may also communicate with additional functional elements (not shown), such as those described herein as relating to additional channels, SUT processing circuitry, switches, decimators and the like. It is noted that the memory 240 of the controller 150 may be included within the acquisition memory 140, that the acquisition memory 140 may be included within the memory 240 of the controller 150, or that a shared memory arrangement may be provided.

Although the controller 150 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

The signal acquisition system 100 of FIG. 1 generally receives signals under test (SUT) which are digitized, decimated and subsequently processed to create a data record from which respective waveforms for display are derived. The displayed waveforms have associated with them a horizontal parameter and vertical parameter. The horizontal parameter comprises a time parameter while the vertical parameter comprises an amplitude parameter. Control circuitry is responsive to user inputs to adjust the timebase (i.e., time per horizontal division) and amplitude (i.e., Volts per vertical division) of displayed waveform(s). That is, in an oscilloscope having a display device including a grid pattern, a user may select the number of Volts represented by each vertical segment and the amount of time represented by each horizontal segment.

Figure 3:
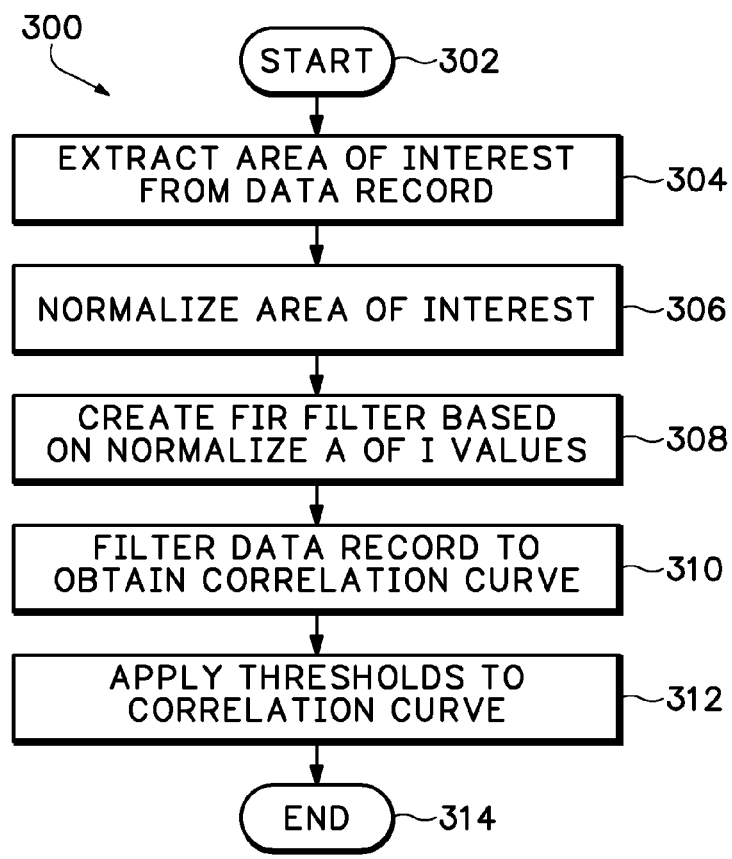
FIG. 3 depicts a flow diagram of a method according to an embodiment of the invention.

FIG. 3 depicts a flow diagram of a method according to an embodiment of the invention. Specifically, FIG. 3 shows a series of method steps 300 for carrying out the method of identifying similar events in long data records captured by the signal acquisition system 100. The method starts at step 302 and proceeds to step 304 where an A of I of a displayed waveform is identified from the long data record and extracted. Identification can be made by known means familiar to those skilled in the art and, in one embodiment of the invention, includes marking the start and end of the A of I with a pair of vertical cursors controlled by a general purpose knob and a selection button that is part of the input device 160. Once identification of the A of I is made, the A of I can be saved as a file to memory (e.g., memory 240 or other suitable device or locations) for future recall and use.

At step 306, the A of I is normalized. Specifically, and in one embodiment of the invention, the normalization includes performing a calculation of a mean value of all the sample values in the A of I and subsequently subtracting that mean value from each sample value in the A of I. At step 308, each of the normalized values are then organized and inserted as coefficients of a finite impulse response (FIR) response filter. That is, from the mathematical point of view, the FIR filter is in the form of a matrix wherein the coefficients of said matrix define the characteristics of the filter. In one embodiment, the filter matrix is a one dimensional matrix of $2n+1$ coefficients. For each point on the acquired waveform (defined as a center point for each normalization step), there are n coefficients on either side of the center point where $2n+1$ is the number of samples in the A of I. All coefficients are multiplied by their corresponding sample values on the waveform which are then summed up to arrive at the correlation output value. In one example, up to 480 coefficients are stored and processed. In this particular case, the characteristics are derived by the normalized values of the sample values of the A of I.

After the filter coefficients are derived and the filter is created, the data record is filtered by the FIR filter at step 310. The filter output generates a correlation curve. The values of the correlation curve are compared with one or more user defined thresholds, and positions where the value exceeds a threshold are marked on a display of the original waveform at step 312. Methods of marking are selected from the group consisting of highlighting the A of I matching portion of the original waveform and applying tick marks to correlating points. In one embodiment of the invention, highlighting is performed by displaying points of interest in a first color and displaying the original waveform in a second color. For example, amber is used to identify points of interest, although any other colors within the specifications of a display device are possible. In an alternate embodiment, the highlighting is performed by displaying the points of interest at a relatively different display intensity. In one embodiment, the highlighting is performed by reducing the relative displayed intensity of the original waveform and displaying points of interest at a higher relative intensity. The method ends at step 314.

The correlation curve is a visual representation of a comparison of the A of I to the rest of the original waveform. Specifically, positive peaks are produced that correspond to areas with the same subsets of positive and negative values (as compared to the original waveform). The filter also outputs negative peaks corresponding to areas with inverted subsets of positive and negative values (in compared to the acquired waveform). Note that normalization removes the DC component from the filter output. In one embodiment of the invention, specially designed hardware is included in the system 100 to perform FIR filtering and to apply the threshold to the correlation curve output. In an alternate embodiment, general purpose central processing units (CPUS) or digital signal processors (DSPs) are used to perform the same function.

The merits of the subject invention can be more greatly appreciated and understood by inspection of FIG. 4. Specifically, FIG. 4 depicts a display screen 400 depicting four reference waveforms (labeled on the screen as R1, R2, R3 and R4. Specifically, first reference waveform R1 shown as a second waveform 404 on screen 400 is the particular waveform that is being acquired and subsequently analyzed. Reference waveform R4 depicted as first curve 402 on screen 400 is an identified A of I of reference waveform R1. Reference waveform R2 is shown as a fourth curve 408 at the bottom of screen 400 which depicts the correlation output of waveform R1 with the identified A of I waveform R4. Specifically, waveform R2 shows major positive peaks at positions 30 and 130 where there is a high degree of correlation in the subsets of positive and negative values between the A of I waveform R4 and the acquired reference waveform R1. Oppositely, major negative peaks are shown at positions 24, 300 and 492 where there is an extremely low degree of correlation (inversion of subsets of positive and negative values between A of I waveform R4 and acquired reference waveform R2). For sake of completion, reference waveform R3, depicted as third curve 406 on screen 400, is a decimated version of reference waveform R2. Specifically, only every second sample point from the A of I and the reference waveform are used to compute and subsequently display a correlation output. As such, the same relative peaks and valleys still exist as those shown in reference waveform R2; however, the relative accuracy of waveform R3 is slightly less than that of reference waveform R2.

The degree of correlation (and the resultant relative increase or decrease in the peaks of the correlation curves 406 or 408) is fine tuned by a threshold level being established during processing. The threshold can be for example a user defined variable that is inserted into one of the programs 244, calculated during the extraction of the A of I or dynamically controlled via feedback about the number and location of events whose correlation value exceeds the threshold. One skilled in the art understands that a higher relative threshold reduces the number of correlation events.

Additionally, one of the programs (or the method in general) incorporates the concept of holdoff to improve data acquisition and correlation. Holdoff prevents the capturing of new data for a given time x after a trigger event because there is a reasonable and statistical assurance that another trigger event will not occur during the x-defined interval. Specifically and in one embodiment, if a high degree of correlation is found between the A of I and the acquired waveform, correlation processing of subsequent portion of the waveform immediately following the high correlation event (the trigger event) is not performed for x amount of time and then restarted. Non-processing is based on the statistical assumption that another high degree of correlation will not occur during the interval x. As such, the total processing time for correlation is reduced. One skilled in the art will also appreciate that by processing less data (especially during a statistically low correlation interval), there is also a reduced likelihood of false alarms.

The above-described invention advantageously provides an apparatus and means to extract an arbitrary section of an acquired waveform and use such arbitrary section (A of I) as a baseline to review the remaining portion of the waveform. The method does not rely on fixed, known shapes (which may or may not be present in the acquired waveform) which may result in a poor correlation curve characteristic. Instead, the method takes advantage of operator-defined points of interest in the acquired waveform and uses such points of interest to create a more highly accurate depiction of the correlation between the A of I and the acquired waveform. The subject invention also takes advantage of the fact that the complexity of the waveform (and the A of I) does not complicate the analysis of the acquired waveform. That is, since the complexity of the waveform is reduced to a series of mathematical calculations rather than a visual inspection of the curve, it is possible to have a higher accuracy in the correlation than previously possible.

While the foregoing is directed to the preferred embodiment of the present invention, other and further embodiments of the invention may be devised without departing from the basic scope thereof, and the scope thereof is determined by the claims that follow.

What is claimed is:

1. Method for correlating data records acquired in a signal acquisition device comprising:
    extracting an area of interest from said data record displayed on said signal acquisition device;
    normalizing the area of interest;
    creating a filter based upon normalized values of the area of interest;
    passing the data record through said filter to obtain a correlation curve; and
    identifying positions in said data record and marking said displayed data record accordingly where the value of the correlation curve exceeds at least one user defined threshold.

2. The method of claim 1 wherein the step of extracting the area of interest further comprises marking a start and an end of the Area of Interest.

3. The method of claim 1 wherein the normalization of the area of interest further comprises:
obtaining a plurality of points defining the area of interest;
calculating the mean of the said plurality of points; and
subtracting said mean from each of the said plurality of points.

4. The method of claim 3 wherein the step of creating the filter further comprises using the normalized values of the area of interest as coefficients for the filter.

5. The method of claim 1 wherein the filter is a Finite Impulse Response filter.

6. The method of claim 5 wherein the Finite Impulse Response filter further comprises a one dimensional matrix.

7. The method of claim 6 wherein the matrix contains $2n+1$ coefficients where n is a number of coefficients on either side of a center point of a normalized value.

8. The method of claim 1 wherein the step of filtering the data record further comprises passing the data record through a Finite Impulse Response filter.

9. The method of claim 1 further comprising the step of performing holdoff during the filtering process to reduce the amount of processing required in obtaining the correlation curve.

10. The method of claim 1 wherein the marking is performed by selecting from the group consisting of displaying the identified positions in a different color from the data record and displaying the identified positions at a different relative display intensity than the data record.

11. A computer readable medium containing a program which, when executed, performs an operation of correlating an area of interest of an acquired waveform with said acquired waveform, the operation comprising:
extracting an area of interest from a display of said acquired waveform;
normalizing the area of interest;
creating a filter based upon normalized values of the area of interest;
passing said acquired waveform through said filter to obtain a correlation curve; and
identifying positions in said acquired waveform and marking said display accordingly where the value of the correlation curve exceeds at least one user defined threshold.

12. The computer readable medium of claim 11 wherein the step of extracting the area of interest further comprises marking a start and an end of the Area of Interest.

13. The computer readable medium of claim 11 wherein the normalization of the area of interest further comprises:
obtaining a plurality of points defining the area of interest;
calculating the mean of the said plurality of points; and
subtracting said mean from each of the said plurality of points.

14. The computer readable medium of claim 13 wherein the step of creating the filter further comprises using the normalized values of the area of interest as coefficients for the filter.

15. The computer readable medium of claim 11 wherein the filter is a Finite Impulse Response filter.

16. The computer readable medium of claim 15 wherein the Finite Impulse Response filter further comprises a one dimensional matrix.

17. The computer readable medium of claim 16 wherein the matrix contains $2n+1$ coefficients where n is a number of coefficients on either side of a center point of a normalized value.

18. The computer readable medium of claim 11 wherein the step of filtering the data record further comprises passing the data record through a Finite Impulse Response filter.

19. The computer readable medium of claim 11 further comprising the step of performing holdoff during the filtering process to reduce the amount of processing required in obtaining the correlation curve.

20. The method of claim 11 wherein the marking is performed by selecting from the group consisting of displaying the identified positions in a different color from the data record and displaying the identified positions at a different relative display intensity than the data record.

21. An apparatus for correlating data records comprising:
means for acquiring said data records;
means for processing said data records by
extracting an area of interest from said data record displayed on said signal acquisition device;
normalizing the area of interest;
creating a filter based upon normalized values of the area of interest; and
passing the data record through said filter to obtain a correlation curve; and
means for displaying said data records and correlation curve.

22. The apparatus of claim 21 wherein the normalization of the area of interest further comprises:
obtaining a plurality of points defining the area of interest;
calculating the mean of the said plurality of points; and
subtracting said mean from each of the said plurality of points.

23. The apparatus of claim 21 wherein the means for displaying displays an occurrence of the area of interest appearing in the data record in a first color and displays the data record in a second color.

24. The apparatus of claim 21 wherein the means for displaying displays an occurrence of the area of interest appearing in the data record at a different relative display intensity than the data record.

* * * * *